(12) United States Patent
Döpper

(10) Patent No.: US 6,382,920 B1
(45) Date of Patent: May 7, 2002

(54) ARTICLE WITH THERMAL BARRIER COATING AND METHOD OF PRODUCING A THERMAL BARRIER COATING

(75) Inventor: Gebhard Döpper, Aachen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/840,556

(22) Filed: Apr. 23, 2001

Related U.S. Application Data

(63) Continuation of application No. PCT/EP99/07733, filed on Oct. 13, 1999.

(30) Foreign Application Priority Data

Oct. 22, 1998 (EP) .............................. 98119791

(51) Int. Cl.⁷ ................................ F01D 5/14
(52) U.S. Cl. ............................ 416/241 R; 416/241 B
(58) Field of Search ................ 416/241 R, 241 B; 428/623, 629, 632, 633

(56) References Cited

U.S. PATENT DOCUMENTS

| | | |
|---|---|---|
| 4,405,659 A | 9/1983 | Strangman |
| 4,676,994 A | 6/1987 | Demaray |
| 5,087,477 A | 2/1992 | Giggins, Jr. et al. |
| 5,238,752 A | 8/1993 | Duderstadt et al. |
| 5,350,599 A | 9/1994 | Rigney et al. |
| 5,514,842 A | 5/1996 | Strangman |
| 5,840,434 A | * 11/1998 | Kojima et al. ............ 428/632 |
| 6,180,184 B1 | * 1/2001 | Gray et al. ............... 427/453 |
| 6,190,124 B1 | * 2/2001 | Freling et al. .......... 415/173.4 |
| 6,299,971 B1 | * 10/2001 | Maloney .................. 428/312.8 |

FOREIGN PATENT DOCUMENTS

| | | |
|---|---|---|
| EP | 0 139 396 A1 | 5/1985 |
| EP | 0 366 289 A1 | 5/1990 |
| WO | WO 93/18199 | 9/1993 |
| WO | WO 96/31636 | 10/1996 |
| WO | WO 98/13531 | 4/1998 |

* cited by examiner

*Primary Examiner*—Edward K. Look
*Assistant Examiner*—Ninh Nguyen
(74) *Attorney, Agent, or Firm*—Laurence A. Greenberg; Werner H. Stemer; Gregory L. Mayback

(57) ABSTRACT

The article of manufacture, in particular a gas turbine blade, can be exposed to a hot aggressive gas. The article has a base body, to which a respective thermal barrier coating is applied in at least one first surface region and in a second surface region. In the first surface region, the coating has a fine structure that is different from the coating in the second surface region. The method for applying a thermal barrier coating to a product includes electron beam sputtering and reactive gas flow sputtering processes.

24 Claims, 3 Drawing Sheets

ARTICLE WITH THERMAL BARRIER COATING AND METHOD OF PRODUCING A THERMAL BARRIER COATING

CROSS-REFERENCE TO RELATED APPLICATION

This application is a continuation of copending International Application No. PCT/EP99/07733, filed Oct. 13, 1999, which designated the United States.

BACKGROUND OF THE INVENTION

FIELD OF THE INVENTION

The invention relates to an article of manufacture, in particular a component of a gas turbine, having a base body and a thermal barrier coating formed thereon. The invention also relates to a process for applying a thermal barrier coating to an article which can be exposed to a hot aggressive gas and has a base body, in particular a metallic base body.

U.S. Pat. No. 5,238,752 describes a thermal barrier coating system having an intermetallic bond coating. The thermal barrier coating system is applied to a metallic base body, in particular to a Cr—Co steel for an aircraft engine blade. An intermetallic bond coat, in particular of a nickel aluminide or a platinum aluminide, is applied directly on top of that metallic base body. The bond coat is adjoined by a thin ceramic layer of aluminum oxide, to which the actual thermal barrier coating, in particular made from yttrium-stabilized zirconium oxide, is applied. This ceramic thermal barrier coating of zirconium oxide has a columnar structure, the rod-shaped columns being oriented substantially perpendicular to the surface of the base body. This is intended to improve the ability to withstand cyclic thermal loading. The thermal barrier coating is deposited on the base body by means of an electron beam PVD (physical vapor deposition) process. The zirconium oxide is thereby vaporized out of a metal oxide body using an electron beam gun. The process is carried out in a corresponding device, in which the base body is preheated to a temperature of approximately 950° C. to 1000° C. During the coating operation, the base body is rotated at constant speed in the jet of metal oxide.

An electron beam PVD process for producing a ceramic coating is also described in U.S. Pat. No. 5,087,477. There, the ceramic coating has a layer thickness of between 250 and 375 $\mu$m.

U.S. Pat. Nos. 4,405,659 and 5,514,482 each describe components, in particular gas turbine blades, made from a nickel-base or cobalt-base alloy, and in each case a ceramic thermal barrier coating of columnar structure is applied to these components. The mean diameter of the columns is in that case over 2.5 $\mu$m, the layer thickness amounting to approximately 125 $\mu$m. The ceramic thermal barrier coating is applied by means of an EB (electron beam) PVD process.

International PCT publication WO 98/13531 describes a component, in particular a gas turbine blade, which has a ceramic thermal barrier coating of columnar fine structure on a metallic base body, the mean column diameter being less than 2.5 $\mu$m. This small mean column diameter for layer thicknesses of the order of magnitude of over 100 $\mu$m which are used in gas turbine construction is achieved by means of a reactive gas flow sputtering process. In this process, an ionizable gas is passed through a hollow cathode and, on account of the voltages prevailing in the hollow cathode, is ionized, and is thus accelerated toward the inner wall of the hollow cathode. The hollow cathode has the coating material, in particular metallic zirconium, on its inner wall, this material being thrown out by the ions and transported toward the base body which is to be coated.

U.S. Pat. No. 5,350,599 describes a thermal barrier coating for a turbine blade which has a plurality of layers positioned on top of one another. The outer surface layer is of erosion-resistant design, while the layer beneath it is of porous design. Both layers are made from ceramic material and are applied successively by means of a PVD process. The porous or sealed structure of the erosion-resistant outer layer is obtained by varying the process parameters during the coating process. The application of the outer erosion-resistant layer is intended to protect the turbine blade from damage caused by erosion.

European published patent application EP 0 139 396 A1 describes a coating system for a turbine blade in which different coatings are applied in different surface regions, specifically as a function of the temperature occurring on the turbine blade. In this case, a distinction is drawn between a hot end and a cold end of the turbine blade. The various coatings are adapted to the different temperature requirements in particular in terms of their ductility and their creep behavior. For this purpose, they have different chemical compositions. This requires a transition layer to be arranged between adjacent layers of different compositions.

SUMMARY OF THE INVENTION

The object of the present invention is to provide an article of manufacture that can be exposed to hot aggressive gases which overcomes the above-noted deficiencies and disadvantages of the prior art devices and methods of this general kind, and which is formed with a thermal barrier coating that satisfies the attendant requirements. A further object of the invention is to outline a process for coating an article with a thermal barrier coating.

With the above and other objects in view there is provided, in accordance with the invention, an article of manufacture that is to be exposed to hot aggressive gas. The article comprises a base body or substrate having a first surface region and a second surface region, and a thermal barrier coating of uniform chemical composition applied on the base body, the coating having a fine structure in the first surface region different from a fine structure in the second surface region.

In other words, the article of manufacture, in particular a component of a gas turbine, which can be exposed to a hot aggressive gas has a base body and a thermal barrier coating of uniform chemical composition applied to the base body. The coating has different microstructures in a first surface region and in a second surface region and is thus adapted to meet the requirements imposed by the thermomechanical stresses on the product which in each case prevail locally or are to be expected for the particular intended use. The two surface regions lie in the same surface plane or surface layer. They are in particular arranged next to one another. In the surface regions, the thermal barrier coating has a thermal barrier material which is uniform in terms of its chemical composition. The thermal barrier coating can therefore be referred to as a single-material barrier coating. This has the considerable advantage over multimaterial barrier coatings that problems which are inherent to a material transition are avoided. At the same time, on account of the different microstructures, the respective surface regions are designed for the expected loads.

In this case, it is likewise additionally or alternatively possible, in regions which are of geometrically different design, in particular with regard to surface curvature, convexity or concavity, if the local thermomechanical load to be expected is the same, for the fine structure in the geometrically different surface regions still to be of substantially identical form. This particular form of the coating is advantageous in particular in the case of curved components which are exposed to a hot gas stream which leads to locally different thermomechanical loads, since the thermal barrier coating is locally adapted to the thermomechanical stresses, such as temperature and the action of forces as a result of impinging particles, which occur. As a result, it is possible to locally influence, in particular extend, the service life of the thermal barrier coating in a controlled way, so that the duration of use and the service life of the product are also extended.

In accordance with an added feature of the invention, the thermal barrier coating has a fine structure with ceramic columns which are oriented substantially perpendicular to the surface of the base body. In this case, the ceramic columns may have a diameter of a few microns ($\mu$m) at a layer thickness of up to 100 $\mu$m or more. A fine structure with ceramic columns is particularly advantageous, since it is able to follow thermal expansion of the base body particularly in the event of cyclic temperature changes without being damaged.

In accordance with an additional feature of the invention, the ceramic columns in the first surface region have a smaller mean diameter than in the second surface region. Consequently, the thermal barrier coating in the first surface region can generally have a finer fine structure than in the second surface region, with the result that in particular this region of finer fine structure can withstand higher temperatures, in particular temperature change stresses, The thermal barrier coating in the first surface region, which is exposed to higher thermomechanical stresses than the second surface region, preferably has a denser fine structure than the thermal barrier coating in the second surface region.

The article is preferably a component of a thermal machine, in particular of a gas turbine, such as a stationary gas turbine which is used in power plant engineering or an aircraft engine turbine. The product may in this case be designed as a heat shield for a combustion chamber or as a turbine blade, a turbine rotor blade or a turbine guide vane. A turbine blade has a leading edge and a trailing edge, with a pressure side and a suction side arranged on opposite sides between these edges. The leading edge is the area of a turbine blade which is subjected to the highest thermal loads and, moreover, is also exposed to intense erosion conditions on account of the hot gas incident upon it. Locally similar thermomechanical stresses prevail on the suction side and the pressure side. Consequently, a turbine blade preferably has a thermal barrier coating of substantially identical fine structure (second surface region) on the suction side and the pressure side. A finer fine structure of the thermal barrier coating (first surface region) is preferably provided on the leading edge, so that this coating meets the demands imposed by the thermomechanical stresses prevailing in that area. A thermal barrier coating of this type is better able to withstand the thermomechanical stresses than the thermal barrier coating on the suction side and pressure side.

The thermal barrier coating is preferably ceramic. It may contain zirconium oxide ($ZrO_2$) or another ceramic material which is suitable for use at high temperatures, in particular a metal oxide. A zirconium oxide is preferably partially or completely stabilized with yttrium oxide ($Y_2O_3$) or with another oxide of a rare earth element. Alternatively, the thermal barrier coating may also comprise a compound selected from the group consisting of the refractory perovskites, e.g. $LaAlO_3$, $CaZrO_3$, or the spinels, e.g. $MgAl_2O_4$, $MgCr_2O_4$ or $AB_2O_4$, where A represents an element selected from the group consisting of Ni, Co, Ti; B represents Al or Cr, and O represents oxygen.

In accordance with a preferred embodiment, the base body is of metallic design. For applications at high temperatures with corresponding demands imposed on corrosion resistance, nickel-base and/or cobalt-base alloys, as described, by way of example, in U.S. Pat. No. 4,405,659, inter alia, are particularly suitable.

In accordance with another feature of the invention, there is provided an adhesion promoter layer between the base body and the thermal barrier coating. The adhesion promoter layer may be made from an alloy comprising chromium, aluminum, yttrium and/or one of the elements from group IIIb of the periodic system, including the actinides and the lanthanides, and also, in addition or as an alternative, rhenium, while the predominant remainder of the alloy may comprise iron, cobalt and/or nickel. Yttrium-containing alloys of this type are described in the literature by the term "MCrAlY" alloy. Alloys which contain significantly more rhenium than yttrium may be referred to as "MCrAlRe" alloys. An oxide layer, in particular of aluminum oxide, chromium oxide and/or gallium oxide, may be provided between the adhesion promoter layer and the thermal barrier coating. An oxide layer of this type may already have been applied as an oxide or may be formed as a result of oxidation under thermal conditions (thermally grown oxide TGO).

With the above and other objects in view there is also provided, in accordance with the invention, a method of forming a thermal barrier coating on an article to be exposed to a hot aggressive gas. The method comprises the steps of providing a base body and forming on the base body a thermal barrier coating of uniform chemical composition, and thereby forming the thermal barrier coating in a first surface region of the base body with a first fine structure and forming the thermal barrier coating in a second surface region with a second fine structure, and defining the first and second surface regions in accordance with a locally expected thermomechanical loading when the article of manufacture is in use.

In other words, the object relating to a process for applying a thermal barrier coating to a product which can be exposed to a hot aggressive gas is achieved in that a thermal barrier coating of uniform chemical composition is applied to the base body in such a manner that, in a first surface region of the substrate, the thermal barrier coating is formed with a first fine structure and in a second surface region the thermal barrier coating is formed with a second fine structure, in accordance with the locally expected thermomechanical loading when the product is in use.

Consequently, the process provides a product which takes into account the local thermomechanical stresses occurring on the product. In particular, it is thus possible to make the thermal barrier coating more resistant at a region which is subjected to high loads (first surface region) than in a second surface region which is subjected to lower thermomechanical loads. As a result, it is also possible to produce a respective thermal barrier coating of substantially uniform fine structure in a controlled manner in local surface regions which are exposed to substantially identical thermomechanical conditions. This is particularly advantageous if the geometric design of such second surface regions differs, in particular if the curvature differs significantly in terms of size and/or direction (concave, convex).

The process for producing a thermal barrier coating is preferably carried out as an electron beam physical vapor deposition (EB-PVD) process or as a reactive gas flow sputtering process, as described, for example, in WO 98/13531 A1. In the case of the processes for the physical vapor deposition of a thermal barrier coating, the coating process is determined by various process parameters, such as the temperature of the product to be coated, the power of an electron beam gun, acceleration of the particles to be deposited toward the product, gas flow in a coating chamber, supply of oxygen, partial pressure of a reactive gas, overall pressure in the coating chamber, heating capacity of a heater device, rotational speed of the product, relative movement between product and a particle jet which forms the thermal barrier coating and other process parameters. In the process, individual process parameters or a plurality of process parameters are controlled or regulated according to the local demands imposed on the thermal barrier coatings in such a way that the thermal barrier coating is formed according to local requirements.

The process is preferably applied to a blade of a turbomachine, in particular of a gas turbine, in which case the thermal barrier coating on the suction side may have substantially the same fine structure as on the pressure side. In addition or as an alternative, in the case of a blade it is also possible to apply a more resistant thermal barrier coating, in particular with a finer fine structure, to a leading edge, which is exposed to elevated thermomechanical stresses, in particular to erosion, than at surface regions which are exposed to lower stresses. Surface regions which are subjected to lower stresses may include the suction side, the pressure side or the trailing edge of the blade. In this case, the process parameters, such as for example the movement of the product (the turbine blade), which may be executed as a simple rotation of the product about an axis and as a pivoting and/or inclination-changing movement, the local coating rate on that surface of the product which faces a particle deposition crucible, and further process parameters can be adapted to one another in such a way that the locally desired layer structure which is appropriate for the stresses imposed is produced. Parameters which may have an effect in this context include, inter alia, the coating rate, the capacity of a vaporizer gun in EB-PVD processes, the deflection of the vaporizer gun electron beams, the overall pressure in the coating chamber, the partial pressure of a reactive gas, the temperature of the product, the nature of the movement and the relative velocity of the product during the vapor deposition.

By way of example, in the case of a turbine blade a thermal barrier coating which is appropriate for the particular stresses can be produced by linking the vaporization capacity to the rotation of the turbine blade. In this case, when the leading edge of the blade is facing the vaporization crucible, the rotational speed can be increased in combination with a reduced vaporization capacity, so that the coating rate is locally reduced and, at the same time, a dense coating structure is produced. When, for example, the pressure side of the blade is facing toward the vaporization crucible, the rotational speed can be reduced and the vaporization capacity can be increased, so that the layer structure of the thermal barrier coating is less dense and so that, by simultaneously adapting the process for the suction side accordingly, the thermal barrier coating on the suction side and on the pressure side has a substantially identical fine structure.

Other features which are considered as characteristic for the invention are set forth in the appended claims.

Although the invention is illustrated and described herein as embodied in a product with a thermal barrier coating and a method of producing a thermal barrier coating, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
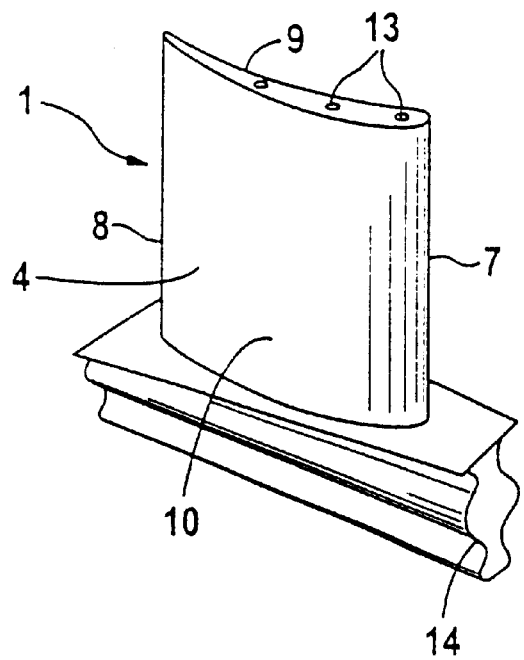
FIG. 1 is a perspective view of a turbine rotor blade.

Referring now to the figures of the drawing in detail and first, particularly, to FIG. 1 thereof, there is seen a perspective view of a turbine blade 1, in particular a rotor blade of a gas turbine. The exemplary rotor blade represents the article of manufacture. The article has a blade root 14, by means of which the turbine blade 1 can be secured in a non-illustrated rotatable shaft. The blade root 14 is adjoined by the actual blade region, which extends from a leading edge 7 to a trailing edge 8. One side of the blade forms a pressure side 9 and the other side forms a suction side 10. Cooling ducts 13 for carrying a cooling medium, in particular cooling air, are provided in the actual blade region. The blade region forms an overall surface 4 with surface regions of different curvature.

Figure 2:
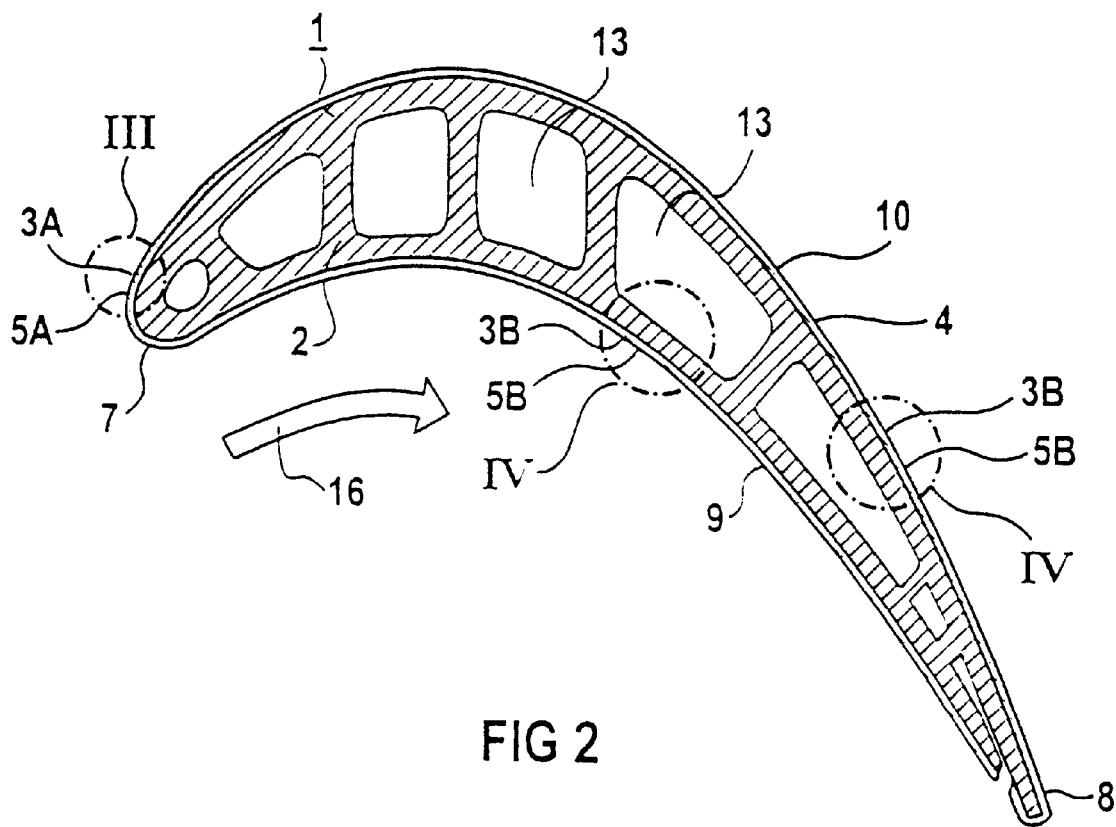
FIG. 2 is a cross section through a turbine blade.

FIG. 2 shows a cross section through a turbine blade 1 of a gas turbine, representing the article. When it is used in a gas turbine, a hot gas 16 flows about the blade 1. In the cross section, the turbine blade 1 extends from the leading edge 7, via the pressure side 9 and the suction side 10, to a trailing edge 8. The turbine blade 1 is formed from a base body 2, in the interior of which a plurality of cooling ducts 13 for guiding cooling air are provided. The entire outer surface 4 of the turbine blade 1 is coated with a thermal barrier coating 5A, 5B. In the region of the leading edge 7 (first surface region 3A), there is a first thermal barrier coating 5A, which is particularly resistant in order to protect the turbine blade 1 from the incident flow of the hot gas 16 which, in addition to imposing high thermal loads on the leading edge 7, may also cause erosion. On the pressure side 9, which has a different curvature from the leading edge 7 and is also subject to lower thermomechanical stresses, a second thermal barrier coating 5B is applied in a second surface region 3B, which may extend substantially over the entire surface of the pressure side 9. This second thermal barrier coating 5B is preferably of less dense design than the first thermal barrier coating 5A, on account of the lower thermomechanical load which prevails there. Similarly, a thermal barrier coating 5B is provided in a second surface region 3B on the suction side 10, the fine structure of which substantially corresponds to the thermal barrier coating 5B on the pressure side 9.

Figure 3:
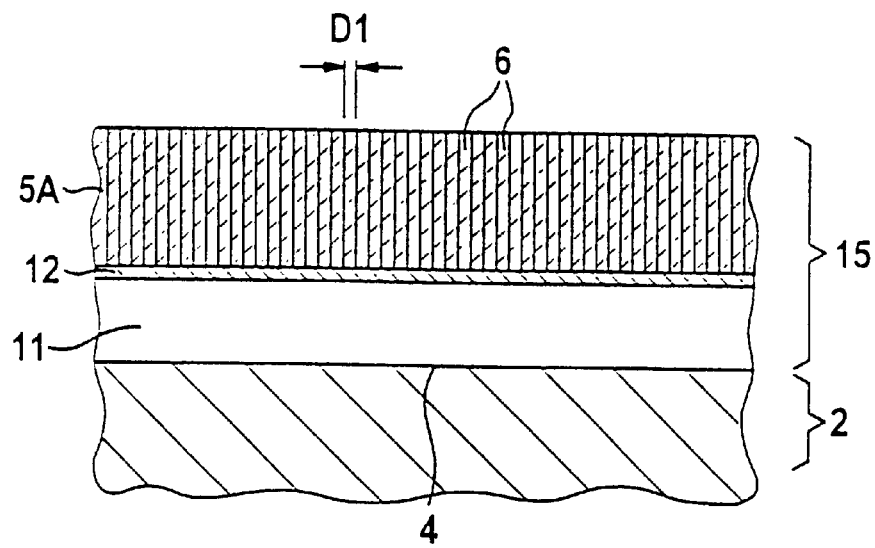
FIGS. 3 and 4 are each a partial section taken through a thermal barrier coating system of the turbine blade in FIG. 2.
Figure 4:
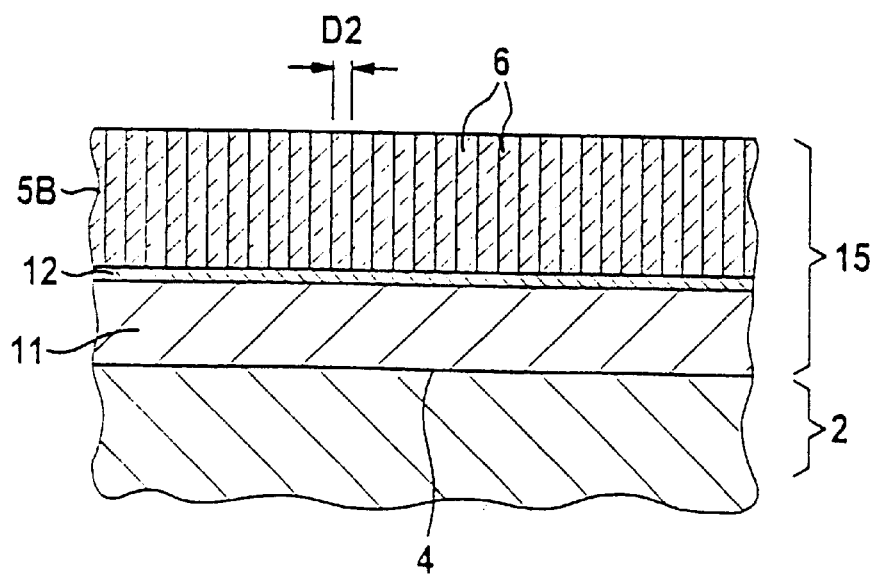

FIGS. 3 and 4 diagrammatically depict the structure of a thermal barrier coating system 15 on the leading edge 7

(FIG. 3) and the suction side 10 or pressure side 9 (FIG. 4). The thermal barrier coating system 15 is applied to the base body 2 and, directly adjoining the base body 2, has an adhesion promoter layer or oxidation-resistant and corrosion-resistant layer 11. The layer 11 is adjoined by an oxide layer 12 and, on top of the oxide layer 12, the actual thermal barrier coating 5A, 5B. The adhesion promoter layer 11 may be an alloy of MCrAlY or MCrAlRe type. The oxide layer 12 may substantially comprise an aluminum oxide or, alternatively or in addition, may contain further metal oxides, such as chromium oxide or gallium oxide. The adhesion promoter layer 11 and the oxide layer 12 selected naturally depends on the material of the base body 2 and of the thermal barrier coating 5A, 5B to be applied, which may, for example, consist of partially stabilized zirconium oxide. The thermal barrier coating 5A, 5B has a fine structure with ceramic columns 6 that are oriented substantially perpendicular to the surface 4 of the base body 2. The ceramic columns 6 each have a mean column diameter D1, D2. The column diameter D1 of the ceramic columns 6 in the region of the leading edge 7 is smaller than the column diameter D2 in the region of the suction side 10 or the pressure side 9. Consequently, the thermal barrier coating 5A on the leading edge 7 is not only denser but also is better able to withstand changing thermomechanical loads without being damaged. In this case, for a layer thickness of the thermal barrier coating 5A of approximately 100 $\mu$m to 200 $\mu$m, the column diameter D1 may lie in the range between 0.5 and 5 $\mu$m, preferably below 2.5 $\mu$m.

Figure 5:
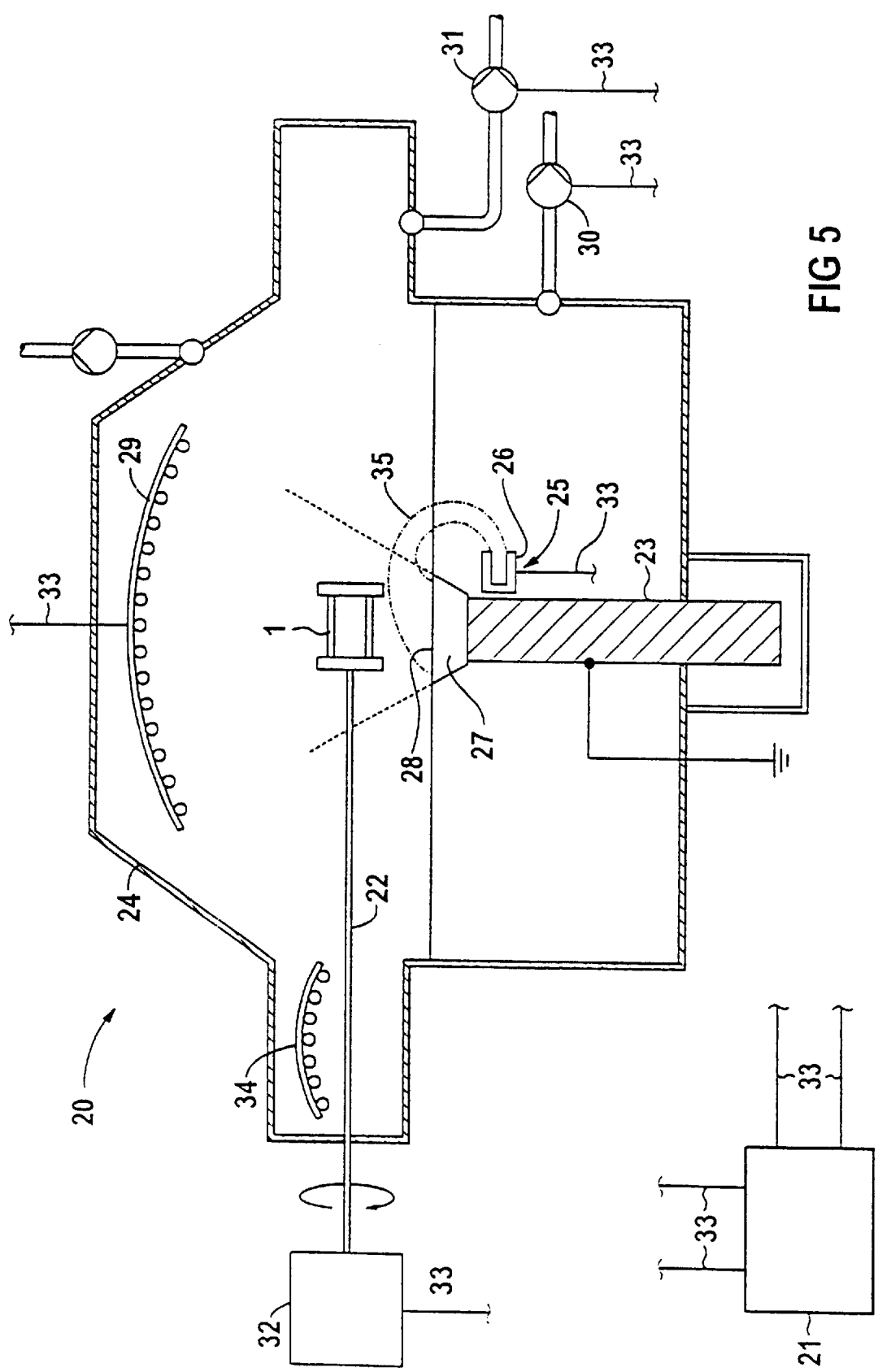
FIG. 5 is a diagrammatic view of a coating unit for coating a turbine blade with a thermal barrier coating.

FIG. 5 shows a diagrammatic longitudinal section through a coating device 20 for applying a thermal barrier coating 5A, 5B to a product 1, in particular a gas turbine blade. The coating device 20 has a coating chamber 24, in which a suitable subatmospheric pressure (vacuum) can be established. By way of example, two pumps, namely a mechanical pump 30 and a diffusion pump 31, are provided in order to produce the subatmospheric pressure. Each of these pumps 30, 31 is connected via a respective connecting line 33 to a control device 21, by means of which the pumping capacity and therefore the vacuum pressure in the coating chamber 24 can be set. In a lower region, the coating chamber 24 has a rod-like coating target 23 made from the material which forms the thermal barrier coating, for example zirconium. This coating target 23 is grounded. The turbine blade which is to be coated is held above the coating target 23 by a rotatable component holder 22 which outside the coating chamber 24 is connected to a drive motor 32. The drive motor 32 is used to rotate the turbine blade 1 about the longitudinal axis of the turbine blade 1, so that the turbine blade 1 is coated on all sides. The drive motor 32 is also connected to the control device 21 via a connecting line 33. A melting pot 27 (vaporization crucible), which is open toward the turbine blade 1, is arranged on that surface 28 of the coating target 23 which faces toward the turbine blade 1.

An electron beam gun 25, which is provided with deflector plates 26 in such a way that an electron beam 35 enters the vaporization crucible 27, is arranged inside the coating chamber 24. It will be understood that the electron beam gun 25 may also be arranged at a different position, if appropriate outside the coating chamber 24 The electron beam gun 25 is likewise connected to the control device 21 via a connecting line 33. A blade heater 29 is arranged above the turbine blade 1 and is likewise connected to the control device 21 via a connecting line 33. Furthermore, a preheating arrangement 34, by means of which it is possible to heat the turbine blade 1 to a preset temperature before the actual coating begins, is provided in the coating chamber 24.

During the coating operation (EB-PVD process), the turbine blade 1 is arranged between the blade heater 29 and the vaporization crucible 27. An electron beam 35 which emerges from the electron beam gun 25 makes the coating material 23 in the vaporization crucible 27 melt (vaporize). The coating material leaves the vaporization crucible 27 toward the turbine blade 1 and is deposited on the latter as a thermal barrier coating 5A, 5B. The coating material may in this case already have the chemical composition in which it is to be present in the thermal barrier coating 5A, 5B, in particular may already be in the form of an oxide, for example zirconium oxide. It is also possible, as part of a reactive gas flow sputtering process, to vaporize a metallic coating material which, after it has been deposited on the turbine blade 1, is oxidized by oxygen or has already been oxidized to form the desired metal oxide on its way to the turbine blade 1.

The process parameters of the coating operation are controlled or regulated by the control device 21 in such a way that, according to local demands imposed on the thermal barrier coating 5A, 5B, corresponding deposition takes place, so as to form the thermal barrier coating 5A, 5B in the different surface regions 3A, 3B of the turbine blade 1. By way of example, the vaporization capacity may be linked to the rotation of the component in such a way that when the leading edge 7 of the turbine blade 1 is facing toward the vaporization crucible 27 the rotational speed is increased by the drive motor 32, combined with a reduced vaporization capacity (capacity of the electron beam gun 25), so that the coating rate falls locally and, at the same time, a dense layer structure of the thermal barrier coating 5A is achieved. When the pressure side 10 of the turbine blade 1 or the suction side 9 of the turbine blade 1 is lying opposite the vaporization crucible 27, the rotational speed can be reduced and the vaporization capacity increased, so that a less dense thermal barrier coating can be produced.

I claim:

1. An article of manufacture adapted to be exposed to hot aggressive gas, comprising: a base body having a first surface region and a second surface region, and a thermal barrier coating of uniform chemical composition applied on said base body, said coating having a fine structure in said first surface region different from a fine structure in said second surface region.

2. The article according to claim 1, wherein the fine structure of said thermal barrier coating is defined by ceramic columns oriented substantially perpendicular to a surface of said base.

3. The article according to claim 2, wherein said ceramic columns in said first surface region have a smaller mean diameter than in said second surface region.

4. The article according to claim 1, wherein said thermal barrier coating has a finer fine structure in said first surface region than in said second surface region.

5. The article according to claim 1, wherein said thermal barrier coating has a denser fine structure in said first surface region than in said second surface region.

6. The article according to claim 1, wherein said base body and said thermal barrier coating are configured as a component of a thermal machine.

7. The article according to claim 6, wherein said base body and said thermal barrier coating together form a heat shield of a combustion chamber.

8. The article according to claim 1, wherein said base body and said thermal barrier coating together form a component of a gas turbine.

9. The article according to claim 1, wherein said thermal barrier coating contains a material selected from the group consisting of zirconium oxide, a compound from the group of refractory perovskites, and a compound from the group of the spinels.

10. The article according to claim 9, wherein said thermal barrier coating is partially or completely stabilized with an oxide selected from the group consisting of yttrium oxide and an oxide of the rare earths.

11. The article according to claim 1, wherein said base body is a metallic substrate.

12. The article according to claim 1, wherein said metallic substrate is formed of a material selected from the group consisting of a nickel-base alloy and a cobalt-base alloy.

13. The article according to claim 13, which further comprises an adhesion promoter layer disposed between said base body and said thermal barrier coating.

14. The article according to claim 13, wherein said adhesion promoter layer is an MCrAlY alloy, where Cr represents chromium, Al represents aluminum, M represents one or more elements selected from the group consisting of iron, cobalt and nickel, and Y represents one or more elements from group IIIb of the periodic system including the actinides and the lanthanides and rhenium.

15. A turbine blade, comprising a base body having a first surface region and a second surface region, and a thermal barrier coating of uniform chemical composition applied on said base body, said coating having a fine structure in said first surface region different from a fine structure in said second surface region.

16. The turbine blade according to claim 15, wherein said base body has a cross section with a leading edge, a trailing edge, and extending between said leading edge and said trailing edge, opposite one another, a pressure side and a suction side, and wherein said thermal barrier coating has substantially the same fine structure on said suction side and on said pressure side, and said thermal barrier coating has a relatively finer fine structure on said leading edge.

17. The turbine blade according to claim 15, wherein said thermal barrier coating contains a material selected from the group consisting of zirconium oxide, a compound from the group of refractory perovskites, and a compound from the group of the spinels.

18. The turbine blade according to claim 11, wherein said thermal barrier coating is partially or completely stabilized with an oxide selected from the group consisting of yttrium oxide and an oxide of the rare earths.

19. A method of forming a thermal barrier coating on an article to be exposed to a hot aggressive gas, which comprises providing a base body and forming on the base body a thermal barrier coating of uniform chemical composition, and thereby forming the thermal barrier coating in a first surface region of the base body with a first fine structure and forming the thermal barrier coating in a second surface region with a second fine structure, and defining the first and second surface regions in accordance with a locally expected thermomechanical loading when the article of manufacture is in use.

20. The method according to claim 19, which comprises configuring the article as a blade of a turbomachine having a suction side and a pressure side, and forming the thermal barrier coating on the suction side with the same fine structure as on the pressure side.

21. The method according to claim 19, which comprises configuring the article as a blade of a turbomachine having a leading edge and, adjoining the leading edge, a suction side and a pressure side, and the thermal barrier coating is formed with a finer fine structure on the leading edge than on one of the suction side and pressure side.

22. The method according to claim 19, wherein the step of forming the thermal barrier coating comprises carrying out a process selected from the group of processes consisting of an electron beam physical vapor deposition (PVD) process and a reactive gas flow sputtering process.

23. The method according to claim 22, which comprises defining and controlling process parameters according to the fine structure of the thermal barrier coatings to be achieved.

24. The method according to claim 23, which comprises selecting the process parameters from the group of parameters consisting of a relative movement between the article and a particle jet applying the thermal barrier coating, a coating rate, an overall pressure in a coating chamber, a partial pressure of a reactive gas, and a temperature of the product.

* * * * *